United States Patent [19]

Shannon

[11] 4,134,123

[45] Jan. 9, 1979

[54] HIGH VOLTAGE SCHOTTKY BARRIER DIODE

[75] Inventor: John M. Shannon, Whyteleafe, England

[73] Assignee: U.S. Philips Corporation, New York, N.Y.

[21] Appl. No.: 817,724

[22] Filed: Jul. 21, 1977

[30] Foreign Application Priority Data

Aug. 9, 1976 [GB] United Kingdom ............... 33044/76

[51] Int. Cl.² .................. H01L 29/48; H01L 29/56; H01L 29/64
[52] U.S. Cl. ........................................ 357/15; 357/22
[58] Field of Search ..................... 357/15, 22

[56] References Cited
U.S. PATENT DOCUMENTS

| 3,252,003 | 5/1966 | Schmidt | 357/22 |
| 3,513,366 | 5/1970 | Clark | 357/15 |
| 3,614,560 | 10/1971 | Anantha | 357/15 |
| 3,646,411 | 2/1972 | Iwasa | 357/15 |
| 3,999,281 | 12/1976 | Goronkin et al. | 357/15 |

Primary Examiner—Andrew J. James
Attorney, Agent, or Firm—Thomas A. Briody; Steven R. Biren

[57] ABSTRACT

An improved high voltage Schottky barrier diode includes a semiconductor layer having two adjacent sublayers of the same type conductivity but different doping concentrations. A plurality of isolated discrete regions of a second type conductivity opposite to that of the first are provided along the boundary region between the sublayers and beneath the Schottky junction. The invention results in an improved high voltage Schottky diode in which the reverse characteristics are substantially enhanced.

9 Claims, 8 Drawing Figures

IMPROVED HIGH VOLTAGE SCHOTTKY BARRIER DIODE

This invention relates a semiconductor device having a high-voltage rectifying metal-to-semi-conductor junction comprising a semiconductor body having a semiconductor layer of one conductivity type adjoining a surface of the body, a metal layer extending in contact with a portion of said surface and there forming a rectifying junction with the layer of the one conductivity type and a low resistance ohmic connection to the layer of the one conductivity type.

Rectifying metal-to-semiconductor junctions, usually referred to as Schottky junctions, are frequently used in semiconductor technology, for example in diodes for switching purposes in which a high switching speed is required. A high switching speed in a Schottky junction is obtained inter alia because the operation is based upon the transport of majority charge carriers and the stored charge in a Schottky junction is small, in particular much smaller than in a p-n junction. The forward voltage at low current of a Schottky junction is low in comparison to that of a p-n junction. Diodes having Schottky junctions however do suffer from the disadvantage that in the reverse direction there is a rapid increase in current with applied voltage and that because of the strong surface field dependance of the reverse current the reverse characteristic of a Schottky junction is soft in comparison with a diffused p-n junction diode. Furthermore Schottky diodes generally have a greater leakage current. For this reason the use of Schottky diodes as high voltage rectifiers has been restricted. It has long been recognized that if the reverse characteristics of a Schottky diode can be improved substantially, the Schottky diode, with its inherent majority charge carrier transport property and low forward voltage drop, can be used in addition to the said use as a high speed switch, as a high power rectifier. Thus various attempts have been made to improve the characteristics of a Schottky diode. Hitherto these attempts have been based upon the recognition that the soft reverse characteristic of a conventional Schottky junction is due primarily to an edge effect at the periphery of the metal-to-semiconductor contact where a high field concentration gives rise to excess leakage current and low reverse breakdown voltage. Therefore various structures have been proposed to limit this edge effect and these are generally based on the formation of a so-called guard ring which is formed by a surface adjoining region of opposite conductivity type to the main semiconductor body on which the Schottky junction is formed, the guard ring extending around the periphery of the metal-to-semiconductor contact and being contacted by the metal layer which forms the Schottky junction. In many of these structures the metal layer is in contact with the semiconductor surface in an aperture in an insulating layer on the semiconductor surface, the metal layer having a peripheral portion extending for a small distance up over the edge of the insulating layer around the aperture, the guard ring in addition to being contacted at the surface at the edge of the aperture also being overlaid by the peripheral portion of the metal layer insulated from said guard ring by the insulating layer and thereby an MIS structure being formed. The provision of diffused guard ring structures has been found to considerably improve the reverse characteristics of Schottky diodes but a disadvantage is that the guard ring forms a rectifying p-n junction of the same polarity as the Schottky barrier and under conditions of forward bias sufficient current may flow across the guard ring junction to cause significant injection of minority charge carriers into the main semiconductor bulk below the Schottky barrier. Such minority carrier injection may degrade the recovery time. In some other devices the surface adjoining region of the opposite conductivity type is omitted and the protection is effectively constituted solely by the MIS structure formed by the peripheral portion of the metal contact layer extending over the insulating layer at the edge of the aperture in the insulating layer.

Even with the provision of the described guard ring structures and/or extended metal contact MIS structures the improvement obtained in reverse breakdown voltage still falls short of that obtainable in high voltage p-n junction diode rectifiers. Furthermore in all these structures the reverse current is still dependent upon the magnitude of the surface field in the vicinity of the main part of the Schottky junction and increases with applied bias leading to higher leakage currents in comparison with p-n junction diodes.

According to the invention a semiconductor device having a high-voltage rectifying metal-to-semiconductor junction comprising a semiconductor body having a semiconductor layer of one conductivity type adjoining a surface of the body, a metal layer extending in contact with a portion of said surface and there forming a rectifying junction with the layer of the one conductivity type and a low resistance ohmic connection to the layer of the one conductivity type is characterized in that the layer of the one conductivity type comprises first and second sub-layers of which the first sub-layer extends adjacent the said surface of the body and has a doping different from that of the second sub-layer on which it is present, a plurality of isolated discrete regions of the opposite conductivity type being present in the vicinity of the boundary between the first and second sub-layers and extending at least below the surface portion contacted by the metal layer.

In such a device a rectifying metal-to-semiconductor junction, referred to as a Schottky junction, is formed in which by using appropriate choice of the various dimensions, the forward characteristics of a normal Schottky junction can be maintained while the reverse characteristics are considerably enhanced; in particular the reverse leakage current is reduced to a low level. Said enhancement is due to the isolated discrete regions of the opposite conductivity type being effective, under conditions of a time varying applied reverse voltage, for clamping the surface field to a particular value which is independent of the applied bias. Furthermore, in some structures said regions may be effective, for example without the provision of other special means for the same purpose, in spreading the depletion region at the surface and reducing the electric field at the periphery of the Schottky junction.

The operation of the device structure in accordance with the invention, as will be described in greater detail hereinafter, is based on the storage of charge by the isolated discrete regions when a reverse voltage is applied across the Schottky junction, this charge storage effect coming into operation when the reverse voltage reaches a certain value and serving to clamp the surface field when further increase of the reverse voltage occurs. The provision of the isolated discrete regions is chosen to be such as to have no substantial effect on the conduction mechanism of the device when the junction is in the forward direction. To achieve this it is necessary that the stored charge can be readily dissipated when the applied voltage is subsequently in the forward direction and furthermore that the total charge stored during the application of the reverse voltage is such that the depletion regions associated with the p-n junctions between the charged regions and the layer are insufficient to block conduction paths across the layer of the one conductivity type and passing between the isolated discrete regions when said applied voltage subsequently passes into the forward direction.

The mechanism of charging the isolated discrete regions and limitation of the surface field is based upon the initial increase in reverse bias causing the Schottky junction depletion region to expand towards the isolated discrete regions with a corresponding increase in the surface field. Eventually the depletion region reaches the isolated discrete regions and punch-through to the floating p-n junctions between said regions and the layer of the one conductivity type occurs. Provided a suitable separation exists between the isolated discrete regions the surface field now becomes clamped because on further increase of the reverse voltage the discrete regions become charged as the additional voltage above the punch-through voltage is dropped across the said p-n junctions. The layer doping and the size and separation of the isolated discrete regions will be chosen in accordance with the charge storage required to be effected by said regions having regard to the maximum reverse voltage to be applied. For the subsequent discharge of the isolated discrete regions following reversal of the applied voltage this depends on the availability of minority charge carriers in the layer of the one conductivity type for neutralizing the charge on the isolated discrete regions and steps may be taken to provide for such availability of minority charge carriers.

In a preferred embodiment at least below the surface portion contacted by the metal layer the discrete regions of the opposite conductivity type extend at a substantially uniform depth from said surface. With a view to controlling the distribution of the depletion regions associated with the p-n junctions between the isolated discrete regions and the layer of the one conductivity type when said regions are charged to the maximum extent and the applied voltage changes from the reverse to the forward direction, said distribution being such that current paths between the isolated discrete regions are not wholly blocked, the doping of the layer of the one conductivity type may therefore be suitably tailored. Hence in another preferred embodiment the first sublayer has a higher doping than the second sub-layer. In such a device the depletion regions associated with the p-n junctions between the isolated discrete regions and the layer of the one conductivity type can, during the charging, spread preferentially in the second sub-layer and on subsequent reversal of the applied voltage and prior to the discharge of the depletion regions the distribution of said depletion regions, assuming appropriate spacing between the isolated discrete regions, enables current paths to exist between the isolated discrete regions. Furthermore in this condition the depletion regions remain well separated from the said surface of the layer of the one conductivity type.

Reference herein to a boundary between the first and second sub-layers is to be understood to mean that the progression from the lower doped second sub-layer to the higher doped first sub-layer need not be abrupt. In practice when the first sublayer is provided, for example by epitaxial deposition on the second sub-layer a region of progressively increasing impurity concentration may exist over a thickness of a few microns.

In a preferred embodiment in which the first sub-layer has a higher doping than the second sub-layer the isolated discrete regions of the opposite conductivity type have a substantially uniform spacing and the distance between adjoining edges of two adjacently situated regions is at most equal to two times the thickness of the first sublayer of the one conductivity type. In such a device the enhancement of the surface field above the spacing between adjacently situated regions is limited. Generally it may be preferable to limit the said spacing between adjoining edges of two adjacently situated regions to a value which is at most equal to the thickness of the first sub-layer.

In a further preferred embodiment the first sub-layer has a lower doping than the second sub-layer. The isolated discrete regions of the opposite conductivity type may have a substantially uniform spacing and the distance between adjoining edges of two adjacently situated regions may be greater than two times the thickness of the first sublayer of the one conductivity type.

In the above described other forms of the device the structure may be such that in operation when the isolated discrete regions are charged by the applied reverse voltage to such an extent that when the reverse voltage is reduced at least some of the depletion regions associated with the p-n junctions between the isolated discrete regions and the layer of the one conductivity type punch-back to the Schottky junction at the surface of the first sublayer. In this manner these depletion regions can extract minority charge carriers and therefore serve to limit the potential of the isolated discrete regions to a value equal to the punch-back potential.

In another preferred embodiment in the layer of the one conductivity type there may be a surface adjoining region of the opposite conductivity type situated around the periphery of the surface portion contacted by the metal layer, said metal layer extending in contact with said region of the opposite conductivity type. Thus a so-called 'guard ring' may be present. The minority carrier injection associated with such a structure is advantageously employed to bring about the initial discharge of the isolated discrete regions and open the current paths across the layer of the one conductivity type between the isolated discrete regions.

Further surface adjoining regions of the opposite conductivity type may be present extending as bands around the surface portion contacted by the metal layer. These bands may be employed to further enhance the reverse breakdown voltage of the device and for a full description of the theory of operation of such bands when applied in high voltage planar p-n junctions reference may be made to the article by Y. C. Kao and E. D. Wolley in "Proc. of I.E.E.E.", Vol. 55, No. 8, August 1967, pages 1409 to 1414.

Embodiments of the invention will now be described, by way of example, with reference to the accompanying diagrammatic drawings, in which.

Figure 1:
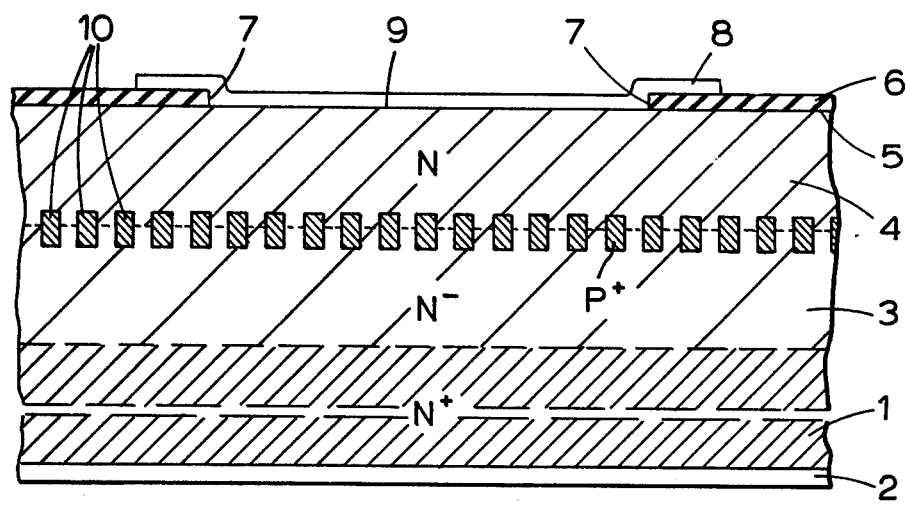
FIGS. 1 and 2 show in a cross-section and plan view part of the semiconductor body and applied layer of a first embodiment of a semiconductor device in accordance with the invention, the section of FIG. 1 being taken along the line I — I in FIG. 2.
Figure 2:
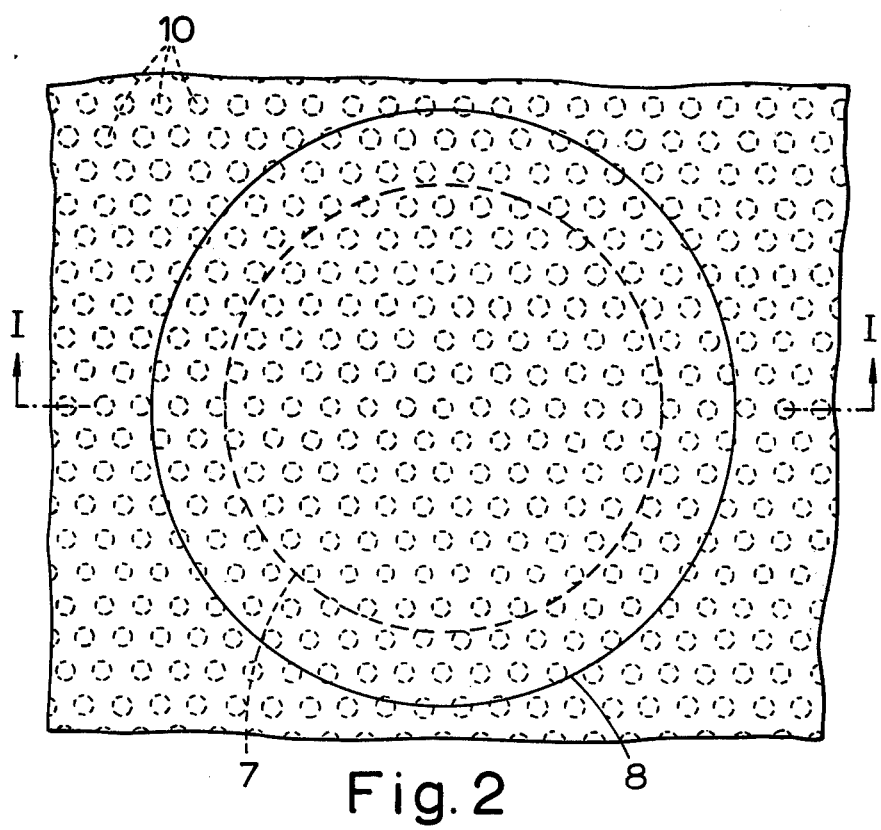

Referring now to FIGS. 1 to 4 the semiconductor device is a high-voltage Schottky diode having a high switching speed with low forward voltage drop and maximum working voltage range of approximately ± 100 volts.

The device comprises a semiconductor body of silicon having an n+ semiconductor substrate 1 of 200 microns thickness and 0.001 ohm. cm. resistivity. On the substrate 1 there is an epitaxial layer structure consisting of a lower n-sub-layer 3 of 10 microns thickness of 20 ohm. cm. resistivity and an upper n-sub-layer 4 of 10 microns thickness and 10 ohm-cm. resistivity. The sub-layer 4 has a surface 5 on which a silicon oxide layer 6 of approximately 1,000 Å thickness is present. A circular aperture 7 of 150 microns diameter is present in the oxide layer 6 and in said aperture a metal layer 8 of nickel of 2,000 Å thickness is present. The metal layer 8 further extends on the surface of the oxide layer 6 at the edge of the aperture and has an overall diameter of 200 microns. The metal layer 8 forms a rectifying metal-to-semiconductor junction 9, a so-called Schottky junction, with the contacted surface portion of the n-type sub-layer 4.

In the vicinity of the boundary between the n⁻-sub-layer 3 and the n-sub-layer 4 there are a plurality of equally spaced diffused p-type isolated discrete regions 10. In the section of FIG. 1 the p-type regions 10 have a width of approximately 7 microns and the spacing between adjoining edges of two adjacently situated regions 10 is approximately 6 microns. The thickness of the diffused p-type regions 10 which extend partly in the sublayer 3 and partly in the sub-layer 4 is approximately 3 microns. The p-type regions 10 are of substantially circular section (see FIG. 2) and have a diameter of approximately 7 microns. On the lower surface of the substrate 1 there is a metal contact layer 2. The cathode of the Schottky diode is formed by the layer 2 and the anode by the metal layer 8. The further connections to the anode and cathode as well as the envelope mounting of the semiconductor body will not be described as they form no essential part in the inventive concept.

Figure 3:
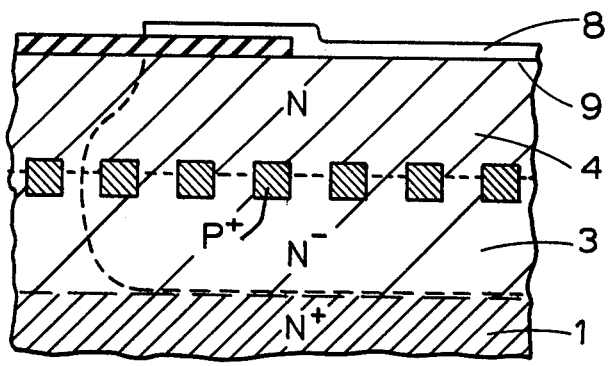
FIGS. 3 and 4 show enlarged views of part of the section of FIG. 1 at two different times in an operational cycle of the device shown in FIGS. 1 and 2.
Figure 4:
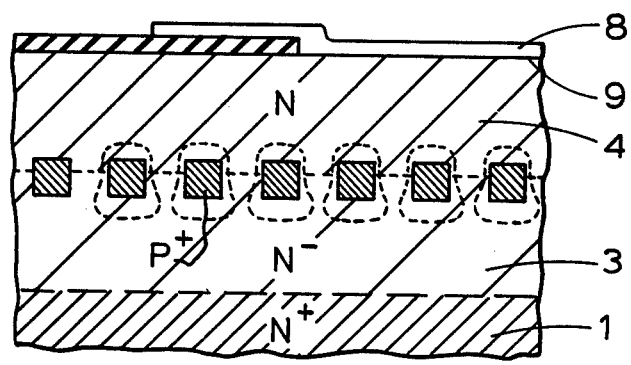

The operation of the Schottky diode with an applied alternating voltage will now be described, reference being additionally made to FIGS. 3 and 4. Consider first a time during the half cycle in which the Schottky junction is in the forward direction and the diode is thus conducting. When this forward voltage reduces to zero the diode current falls to zero. The voltage across the Schottky junction then goes in the reverse direction. In a normal Schottky diode the reverse characteristic is relatively soft because with increasing reverse voltage there is a rapid increase in current with increase in applied field as already described. In the operation of the present embodiment as the reverse voltage increases the depletion region associated with the Schottky junction 9 spreads from said junction into the n-sub-layer 4 and the field at the surface 5 rises. Eventually the depletion region reaches the isolated p-type regions 10 and punch-through occurs to the p-n junctions between said p-type regions 10 and the n-type layer 3, 4. At this point the surface field becomes clamped because further increase of the reverse voltage causes a charging of the p-type regions 10, the additional voltage above the punch-through voltage $V_p$ being dropped across the said p-n junctions. At the time when the maximum reverse voltage V is attained then ideally the isolated regions 10 are at a potential of $V-V_p$ and the bottom of the depletion region approaches a condition of substantially uniform depth in the sub-layer 3. FIG. 3 shows the extent of the depletion region (by a broken line) when said maximum reverse voltage is reached, the depletion region extending substantially entirely across the sub-layer 3 at a substantially uniform depth. The p-type regions are thus charged and as the reverse voltage decreases the charge stored on the p-type regions 10 is redistributed, it being noted that when there is no externally applied field the depletion regions between the p-type regions 10 and the n-type sub-layers 3 and 4 will extend further into the lower doped sub-layer 3 than the higher doped sub-layer 4. FIG. 4 shows such a condition when the applied voltage is on the point of going into the forward direction, it being noted that the depletion regions which are indicated by broken lines do not totally block the current paths between the opposite sides of the layer. Thus holes which become available via the Schottky junction when the applied voltage goes into the forward direction serve to rapidly discharge the p-type regions 10. The number of holes, which will particularly depend upon the precise nature of the interface between the metal layer 8 and the semiconductor layer 4 and upon the nature of the metal, although small, will normally be sufficient to discharge the p-type isolated discrete regions.

In this embodiment the provision of the isolated discrete regions serves to clamp the surface field, under conditions of increasing reverse bias of the Schottky junction 9, to a value of less than $8 \times 10^4$ volts per cm., that is less than one third of the breakdown field. They also serve to spread the depletion layer at the surface and reduce the electric field at the periphery of the diode.

Figure 5:
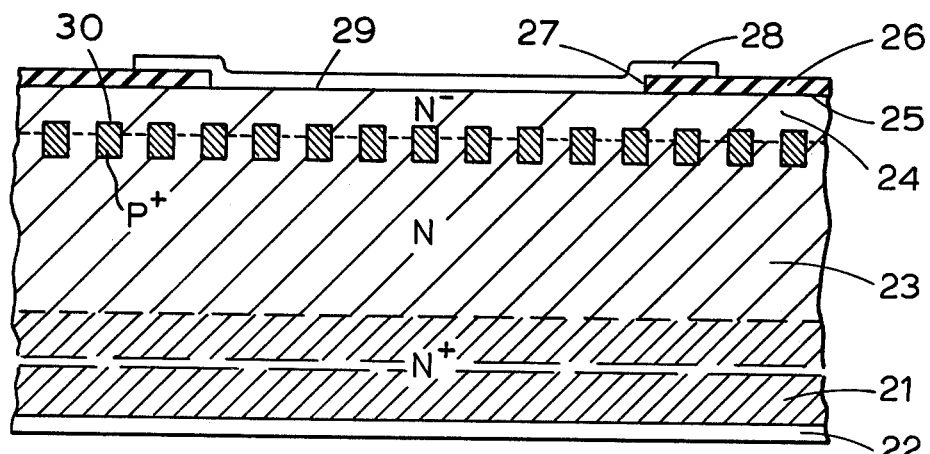
FIG. 5 shows in cross-section part of the semiconductor body and applied layers of a second embodiment of a semiconductor device in accordance with the invention.

Referring now to FIG. 5 a second embodiment will now be described. This device has a semiconductor body of silicon having an n+-substrate 21 of 200 microns thickness and 0.001 ohm. cm. resistivity. On the substrate 21 there is an epitaxial layer structure consisting of a lower n-sub-layer 23 of 15 microns thickness and 2 ohm. cm. resistivity and an upper n⁻-sub-layer 24 of 4 microns thickness and 5 ohm. cm. resistivity. On the surface 25 of the sub-layer 24 there is a silicon oxide layer 26 of 1,000 Å thickness. In an aperture 27 of 150 microns diameter the oxide layer there is a metal layer 28 of molybdenum of 2,000 Å thickness forming a Schottky junction 29 with the $n^{31}$-sub-layer 24. The overall diameter of the metal layer 28 is 200 microns.

In this embodiment implanted p-type isolated discrete regions 30 are present in the vicinity of the boundary between the sub-layers 23 and 24. The regions 30 are of 8 microns diameter, have a pitch of 18 microns (that is a distance between adjoining edges of 10 microns) and a thickness of 3 microns.

Operation of this embodiment in which the maximum working voltage range is approximately ± 100 volts is similar to the preceding embodiment except that with the relative resistivities of the epitaxial sub-layers reversed the mechanism for discharging the charged regions 30 is partly different. After the regions 30 have become charged and the reverse voltage is decreasing from its maximum value the depletion regions associated with the p-n junctions between the regions 30 and the layer 23, 24 expand preferentially in the sub-layer 23 and thus towards the surface 25. Some of the depletion regions punch-back to the Schottky junction 29 and thereby extract holes and the depletion regions remain in this condition thereby limiting the voltage of the isolated discrete regions relative to that of the metal layer 28.

Figure 6:
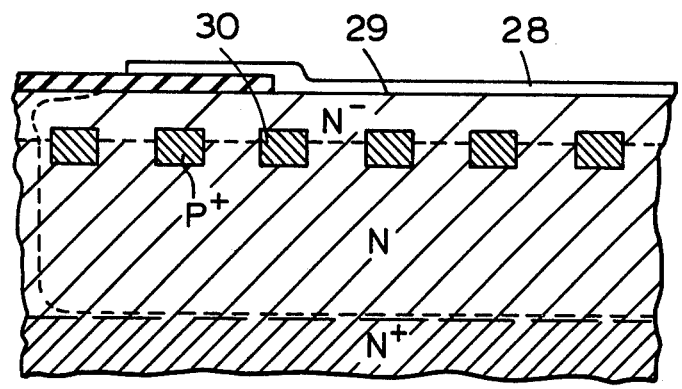
FIGS. 6 and 7 show enlarged views of part of the section of FIG. 5 at two different times in an operational cycle of the device shown in FIG. 5.
Figure 7:
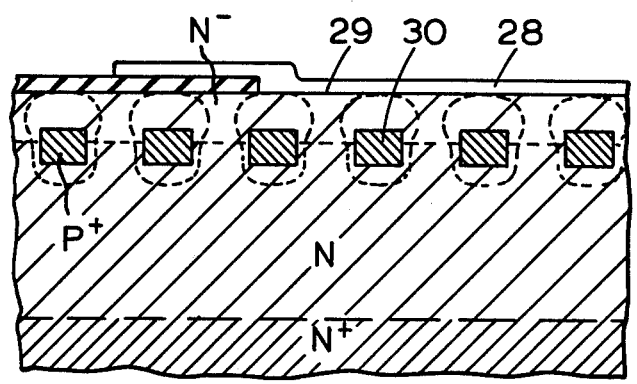

FIG. 6 shows the extent of the depletion region associated with the Schottky junction when the reverse voltage is at its maximum value. The depletion region shown in a broken line extends substantially entirely across the sub-layers 24 and 23 at a substantially uniform depth. The p-type regions are thus charged and ideally at a potential of $V - V_p$ where V is the maximum reverse voltage and $V_p$ is the punch-through voltage from the Schottky junction 29 to the regions 30. FIG. 7 shows the subsequent condition when the applied voltage is on the point of going in the forward direction, the depletion regions between the charged p-type regions 30 and the sub-layers 23, 24 being shown by broken lines.

When the voltage goes into the forward direction holes which become available via the Schottky barrier are normally sufficient to discharge the p-type regions 30.

In this embodiment, as in the previous embodiment the isolated discrete regions serve to clamp the surface field, under conditions of increasing reverse bias, to a value which is less than one third of the breakdown field. Furthermore they also serve to spread the depletion layer at the surface and reduce the electric field at the periphery of the diode.

Figure 8:
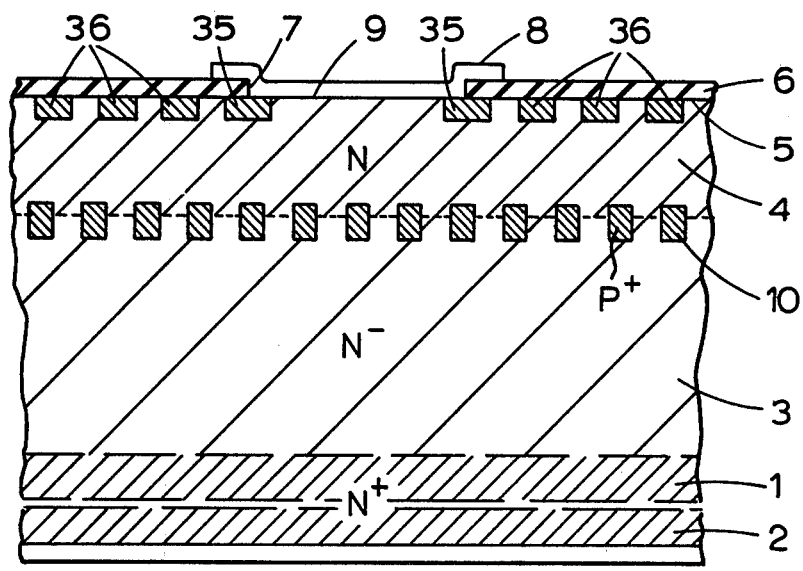
FIG. 8 shows in cross-section part of the semiconductor body and applied layer of a third embodiment of a semiconductor device in accordance with the invention.

Referring now to FIG. 8 a third embodiment will now be described. In this embodiment which in terms of structure is a modification of the first embodiment for higher voltage operation, that is having a maximum working voltage range of approximately ± 600 volts corresponding regions are indicated with the same reference numerals. The $n^+$-substrate 1 has a thickness of 200 microns and resistivity of 0.001 ohm. cm. The $n^-$-lower sub-layer 3 has a thickness of 60 microns and a resistivity of 20 ohm. cm. The n-upper sub-layer 4 has a thickness of 10 microns and a resistivity of 5 ohm. cm. The diffused isolated discrete $p^+$-regions 10 are of 15 microns diameter and have a pitch distance of 35 microns (that is a distance between adjoining edges of 20 microns).

In an aperture 7 of 150 microns diameter in the insulating layer 6 there is a metal layer of chromium of 2,000 Å thickness, said metal layer 8 forming a Schottky junction with the n-sub-layer 4. The metal layer further extends on the insulating layer 6 adjacent the edge of the aperture.

Adjoining the surface of the n-sub-layer 4 below the periphery of the metal layer 8 there is a diffused $p^+$-guard ring 35 having a depth of 5 microns. The guard ring 35 is contacted by the metal layer 8 at the edge of the aperture 7. The guard ring 35 has an internal diameter of 120 microns and an external diameter of 180 microns. Concentric with the guard ring 35 are a plurality of diffused $p^+$-bands 36. The bands each of annular configuration have the same doping as the guard ring 35 and each have a width of 25 microns.

Operation of this device is similar to that of the first embodiment, the $p^+$-guard ring 35 adding to the availability of holes by injection in order to discharge the $p^+$-regions 10 when the applied voltage goes into the forward direction. The guard ring 35 together with the bands 36 further improve the reverse voltage handling capability in this device. However, the $p^+$-regions 10 serve to clamp the surface field, under conditions of increasing reverse bias, at a value which is less than one third of the breakdown field.

It will be appreciated that many modifications may be made within the scope of the invention. In particular with a view to limiting the spreading of the depletion regions associated with the p-n junctions between the isolated discrete regions and the surrounding material of the one conductivity type the doping of the layer of the one conductivity type may be locally varied adjacent the surface, for example by locally increasing the doping of the surface portions of the layer which are located directly above the spacings between the isolated discrete regions, for example using a mask for the required impurity introduction which is in part complementary to the mask used for the impurity introduction when forming the isolated discrete regions.

In addition to Schottky diodes formed in silicon within the scope of the invention there are also included diodes formed in other semiconductor materials, for example gallium arsenide. Also in addition to the formation of devices in the form of Schottky diodes for high voltage rectification the invention may be employed in other devices comprising a Schottky junction, for example, devices in which the Schottky junction is employed as a protection diode, or devices in which the Schottky junction is employed as a controlled current source.

Viewed from the surface of the body at which the Schottky junction is present cross-sectional shapes other than circular may be employed for the isolated discrete regions, for example said regions may be of rectangular cross-section viewed from said surface.

In the specific embodiments described the isolated discrete regions in a device are all located at a substantially uniform depth. However within the scope of the invention are alternative structures in which said regions are located at different depths, for example the regions located below and beyond the periphery of the metal layer forming the Schottky junction may be at a different depth to those of the said isolated discrete regions which are located directly below the contact between the metal layer and the semiconductor body surface. Similarly the spacing between the isolated discrete regions may be correspondingly or separately varied in the said areas. There may also be a plurality of individual layers of isolated discrete regions, for example in a device in which a higher breakdown voltage is required.

In all the specific embodiments described the isolated discrete regions are provided extending across the whole area of the interface between the first and second sub-layers. However satisfactory operation with the inherent advantages of clamping the surface field can still be obtained when the isolated discrete regions are more locally provided, that is at least below the metal-to-semiconductor junction. For enabling the further advantageous feature of reduction of the electric field at the periphery of the diode to be satisfactorily realized it is preferable for the isolated discrete regions to extend laterally beyond the outer edge of the metal-to-semiconductor junction, for example by a distance of at least 50 microns.

What is claimed is:

1. A semiconductor device having a high voltage rectifying metal-to-semiconductor junction, which comprises:

a semiconductor body having a substrate of a first type conductivity;

a semiconductor layer of said first type conductivity adjoining said substrate and forming a surface of said body, said semiconductor layer comprising first and second adjacent sublayers of said first type conductivity and having different doping concentrations, a surface of the first sublayer forming the surface of said body and the second sublayer being located between said first sublayer and the substrate;

a low resistance ohmic connection to the semiconductor layer of said first type conductivity;

a metal layer on the surface of the first sublayer which forms the body surface and in electrical contact with a portion of said surface to form a rectifying junction with said first sublayer; and a plurality of isolated discrete regions of a second type conductivity opposite to that of the first, said regions being distributed along the boundary region between said first and second sublayers of said semiconductor layer and extending at least beneath that portion of the semiconductor body surface contacted by said metal layer.

2. A semiconductor device as claimed in claim 1, wherein at least below the surface portion contacted by the metal layer the discrete regions of the second type conductivity extend at a substantially uniform depth from said surface portion.

3. A semiconductor device as claimed in claim 2, wherein the first sublayer has a higher doping concentration than that of the second sublayer.

4. A semiconductor device as claimed in claim 3, wherein the isolated discrete regions of the second type conductivity have a substantially uniform spacing and the distance between adjoining edges of the two adjacent regions is at most equal to twice the thickness of the first sublayer of the first type conductivity.

5. A semiconductor device as claimed in claim 1, wherein the first sublayer has a lower doping concentration than that of the second sublayer on which it is present.

6. A semiconductor device as claimed in claim 5, wherein the isolated discrete regions of the second type conductivity have a substantially uniform spacing and the distance between adjoining edges of two adjacent regions is greater than twice the thickness of the first sublayer of the first type conductivity.

7. A semiconductor device as claimed in claim 1, further comprising a surface-adjoining region of the second type conductivity in the first sublayer and situated around the periphery of the surface portion of the first sublayer contacted by the metal layer, said metal layer extending in contact with said region of the second type conductivity.

8. A semiconductor device as claimed in claim 7, wherein further surface-adjoining regions of the second type conductivity are provided extending as concentric annular rings around the surface portion contacted by the metal layer.

9. A semiconductor device as claimed in claim 1, wherein the layer of the first type conductivity is provided as an epitaxial layer deposited on said substrate, the doping concentration of said substrate being higher than that of said layer of the first type conductivity.

* * * * *